United States Patent
Dunn et al.

(10) Patent No.: US 10,212,845 B2
(45) Date of Patent: *Feb. 19, 2019

(54) HYBRID REAR COVER AND MOUNTING BRACKET FOR ELECTRONIC DISPLAY

(71) Applicant: Manufacturing Resources International, Inc., Alpharetta, GA (US)

(72) Inventors: William Dunn, Alpharetta, GA (US); Marcos Diaz, Alpharetta, GA (US); Kyle Azevedo, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/494,614

(22) Filed: Apr. 24, 2017

(65) Prior Publication Data

US 2017/0231112 A1  Aug. 10, 2017

Related U.S. Application Data (63) Continuation of application No. 14/645,076, filed on Mar. 11, 2015, now Pat. No. 9,655,289.

(51) Int. Cl.
  *H05K 7/20* (2006.01)
  *G02F 1/133* (2006.01)
  (Continued)

(52) U.S. Cl.
  CPC ... *H05K 7/20145* (2013.01); *G02F 1/133308* (2013.01); *G06F 1/1601* (2013.01);
  (Continued)

(58) Field of Classification Search
  CPC ............ H05K 7/20972; H05K 5/0204; H05K 7/20145; H05K 7/2039; H05K 5/0017;
  (Continued)

(56) References Cited

U.S. PATENT DOCUMENTS 2,029,221 A  1/1936  Burgess et al.
2,678,860 A  5/1954  Peterson
(Continued)

FOREIGN PATENT DOCUMENTS

AU  2011248190 B2  5/2011
CN  2702363 Y  5/2005
(Continued)

OTHER PUBLICATIONS

Itsenclosures, Product Catalog, 2009, 48 pages.
(Continued)

*Primary Examiner* — Adam B Dravininkas
(74) *Attorney, Agent, or Firm* — Standley Law Group LLP (57) ABSTRACT

A system and method for mounting an electronic display is disclosed herein. A rear cover mounting bracket may contain a rear plate and a sidewall which surrounds a perimeter of the plate. A plurality of mounting holes may be placed within the plate to allow fastening the rear plate to a vertical surface. An electronic display assembly module may contain a thermal plate where the attachment of the rear cover mounting bracket to the module creates a plenum which can house one or more electronic components. In a preferred embodiment, the rear plate contains a pair of hooks and the module contains a pair of corresponding cylinders which can be engaged with the hooks so that the module can hang from the hooks.

19 Claims, 6 Drawing Sheets

Related U.S. Application Data (60) Provisional application No. 61/951,344, filed on Mar. 11, 2014.

(51) Int. Cl.
| | | |
|---|---|---|
| *H04N 5/64* | (2006.01) | |
| *G02F 1/1333* | (2006.01) | |
| *H05K 5/00* | (2006.01) | |
| *H05K 7/18* | (2006.01) | |
| *G06F 1/16* | (2006.01) | |
| *G02F 1/1335* | (2006.01) | |

(52) U.S. Cl.
CPC ............. *H04N 5/64* (2013.01); *H05K 5/0017* (2013.01); *H05K 7/18* (2013.01); *H05K 7/2039* (2013.01); *H05K 7/20972* (2013.01); *G02F 1/133603* (2013.01); *G02F 2001/133314* (2013.01); *G02F 2001/133628* (2013.01); *Y10T 29/49826* (2015.01)

(58) Field of Classification Search
CPC ......... G02F 1/133308; G02F 1/133603; G02F 2001/133628; G02F 2001/133314; G02F 1/1333; H04N 5/64; Y10T 29/49826
See application file for complete search history.

(56) References Cited

U.S. PATENT DOCUMENTS

| | | |
|---|---|---|
| 3,984,931 A | 10/1976 | Belokin, Jr. |
| 4,093,355 A | 6/1978 | Kaplit et al. |
| 4,169,327 A | 10/1979 | Stilling |
| 4,267,657 A | 5/1981 | Kloke |
| 4,327,513 A | 5/1982 | de Gunzburg |
| 4,452,000 A | 6/1984 | Gandy |
| 4,547,987 A | 10/1985 | Stilling |
| 4,593,978 A | 6/1986 | Mourey et al. |
| 4,634,225 A | 1/1987 | Haim et al. |
| 4,748,765 A | 6/1988 | Martin |
| 4,759,143 A | 7/1988 | Pomerleau |
| 4,763,993 A | 8/1988 | Vogeley et al. |
| 4,817,317 A | 4/1989 | Kovalak, Jr. |
| 4,903,423 A | 2/1990 | Hinca |
| 4,905,390 A | 3/1990 | Stilling |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,247,374 A | 9/1993 | Terada |
| 5,282,114 A | 1/1994 | Stone |
| 5,293,930 A | 3/1994 | Pitasi |
| 5,299,109 A | 3/1994 | Grondal |
| 5,423,142 A | 6/1995 | Douglas et al. |
| 5,432,526 A | 7/1995 | Hyatt |
| 5,457,905 A | 10/1995 | Kaplan |
| 5,493,802 A | 2/1996 | Simson |
| 5,535,816 A | 7/1996 | Ishida |
| D373,120 S | 8/1996 | Andre et al. |
| 5,559,614 A | 9/1996 | Urbish et al. |
| 5,621,614 A | 4/1997 | O'Neill |
| 5,657,641 A | 8/1997 | Cunningham et al. |
| 5,717,424 A | 2/1998 | Simson et al. |
| 5,748,269 A | 5/1998 | Harris et al. |
| 5,755,050 A | 5/1998 | Aiken |
| 5,765,743 A | 6/1998 | Sakiura et al. |
| 5,767,489 A | 6/1998 | Ferrier |
| 5,803,424 A | 9/1998 | Keehn et al. |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,899,027 A | 5/1999 | St. Louis |
| 5,903,433 A | 5/1999 | Gudmundsson |
| D415,736 S | 10/1999 | Witte |
| 5,991,153 A | 11/1999 | Heady et al. |
| 6,003,015 A | 12/1999 | Kang et al. |
| 6,007,205 A | 12/1999 | Fujimori |
| 6,050,833 A | 4/2000 | Danzyger et al. |
| 6,089,751 A | 7/2000 | Conover et al. |
| 6,104,451 A | 8/2000 | Matsuoka et al. |
| 6,157,432 A | 12/2000 | Helbing |
| 6,172,869 B1 | 1/2001 | Hood, III et al. |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,231,446 B1 | 5/2001 | Majima et al. |
| 6,351,381 B1 | 2/2002 | Bilski et al. |
| 6,392,727 B1 | 5/2002 | Larson et al. |
| 6,405,463 B1 | 6/2002 | Roddy et al. |
| 6,417,900 B1 | 7/2002 | Shin et al. |
| 6,428,198 B1 | 8/2002 | Saccomanno et al. |
| 6,469,752 B1 | 10/2002 | Ishikawa et al. |
| 6,473,150 B1 | 10/2002 | Takushima et al. |
| D467,561 S | 12/2002 | Kosciolek |
| 6,493,440 B2 | 12/2002 | Gromatsky et al. |
| 6,494,429 B2 | 12/2002 | Tajima |
| 6,504,713 B1 | 1/2003 | Pandolfi et al. |
| 6,535,266 B1 | 3/2003 | Nemeth et al. |
| 6,557,284 B2 | 5/2003 | Nolan |
| 6,628,355 B1 | 9/2003 | Takahara |
| 6,714,410 B2 | 3/2004 | Wellhofer |
| 6,727,468 B1 | 4/2004 | Nemeth |
| 6,748,685 B2 | 6/2004 | Peel |
| 6,758,002 B1 | 7/2004 | Duguay |
| 6,825,828 B2 | 11/2004 | Burke et al. |
| 6,839,104 B2 | 1/2005 | Taniguchi et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 6,962,528 B2 | 11/2005 | Yokota |
| 6,976,330 B2 | 12/2005 | Milliken |
| 7,015,470 B2 | 3/2006 | Faytlin et al. |
| 7,059,757 B2 | 6/2006 | Shimizu |
| 7,083,285 B2 | 8/2006 | Hsu et al. |
| D530,686 S | 10/2006 | Reza |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfeller |
| D544,848 S | 6/2007 | Marz et al. |
| 7,226,176 B1 | 6/2007 | Huang |
| 7,269,023 B2 | 9/2007 | Nagano |
| 7,284,874 B2 | 10/2007 | Jeong et al. |
| 7,292,435 B2 | 11/2007 | She |
| 7,339,782 B1 | 3/2008 | Landes et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,513,830 B2 | 4/2009 | Hajder et al. |
| 7,535,543 B2 | 5/2009 | Dewa et al. |
| D595,678 S | 7/2009 | Dunn |
| 7,589,958 B2 | 9/2009 | Smith |
| 7,601,067 B2 | 10/2009 | Anderson |
| 7,602,469 B2 | 10/2009 | Shin |
| 7,609,506 B2 | 10/2009 | Aguirre |
| D608,775 S | 1/2010 | Leung |
| 7,667,964 B2 | 2/2010 | Kang et al. |
| 7,752,858 B2 | 7/2010 | Johnson et al. |
| 7,753,567 B2 | 7/2010 | Kang et al. |
| 7,768,775 B2 | 8/2010 | Kim |
| 7,800,706 B2 | 9/2010 | Kim et al. |
| 7,813,124 B2 | 10/2010 | Karppanen |

(56) References Cited

U.S. PATENT DOCUMENTS

| | | |
|---|---|---|
| 7,903,416 B2 | 3/2011 | Chou |
| 7,985,139 B2 | 7/2011 | Lind et al. |
| 7,995,342 B2 | 8/2011 | Nakamichi et al. |
| 8,004,648 B2 | 8/2011 | Dunn |
| 8,006,435 B2 | 8/2011 | DeBlonk et al. |
| 8,016,452 B2 | 9/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,116,081 B2 | 2/2012 | Crick, Jr. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,418,387 B2 | 4/2013 | Swatt et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,537,302 B2 | 9/2013 | Dunn |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,854,572 B2 | 10/2014 | Dunn |
| 8,854,595 B2 | 10/2014 | Dunn |
| 8,879,042 B2 | 11/2014 | Dunn |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,456,525 B2 | 9/2016 | Yoon et al. |
| 2001/0001459 A1 | 5/2001 | Savant et al. |
| 2001/0019454 A1 | 9/2001 | Tadic-Galeb et al. |
| 2001/0043290 A1 | 11/2001 | Yamamoto |
| 2001/0043293 A1 | 11/2001 | Inoue |
| 2002/0033919 A1 | 3/2002 | Sanelle et al. |
| 2002/0101553 A1 | 8/2002 | Enomoto et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0167637 A1 | 11/2002 | Burke et al. |
| 2003/0007109 A1 | 1/2003 | Park |
| 2003/0020884 A1 | 1/2003 | Okada et al. |
| 2003/0039094 A1 | 2/2003 | Sarkinen et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035558 A1 | 2/2004 | Todd et al. |
| 2004/0036834 A1 | 2/2004 | Ohnishi et al. |
| 2004/0103570 A1 | 6/2004 | Ruttenberg |
| 2004/0105159 A1 | 6/2004 | Saccomanno et al. |
| 2004/0165139 A1 | 8/2004 | Anderson et al. |
| 2004/0212548 A1 | 10/2004 | Ruttenberg |
| 2004/0223299 A1 | 11/2004 | Ghosh |
| 2004/0257492 A1 | 12/2004 | Mai et al. |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0105178 A1 | 5/2005 | Kim |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0229630 A1 | 10/2005 | Richter et al. |
| 2005/0237714 A1 | 10/2005 | Ebermann |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1* | 6/2006 | Cho .................. F04D 29/582 349/161 |
| 2006/0137294 A1 | 6/2006 | Waits et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0215421 A1 | 9/2006 | Chang et al. |
| 2006/0218828 A1 | 10/2006 | Schrimpf et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0283579 A1 | 12/2006 | Ghosh et al. |
| 2007/0019419 A1 | 1/2007 | Hafuka et al. |
| 2007/0021217 A1 | 1/2007 | Wu |
| 2007/0030879 A1 | 2/2007 | Hatta |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0103863 A1 | 5/2007 | Kim |
| 2007/0103866 A1 | 5/2007 | Park |
| 2007/0115686 A1 | 5/2007 | Tyberghien |
| 2007/0139574 A1 | 6/2007 | Ko et al. |
| 2007/0139929 A1 | 6/2007 | Yoo et al. |
| 2007/0140671 A1 | 6/2007 | Yoshimura |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0253205 A1 | 11/2007 | Welker |
| 2007/0267174 A1 | 11/2007 | Kim |
| 2007/0276507 A1 | 11/2007 | Bertram et al. |
| 2008/0002350 A1 | 1/2008 | Farrugia |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0100186 A1 | 5/2008 | Li |
| 2008/0148609 A1 | 6/2008 | Ogoreve |
| 2008/0209934 A1 | 9/2008 | Richards |

(56) References Cited

U.S. PATENT DOCUMENTS

| | | |
|---|---|---|
| 2008/0218446 A1 | 9/2008 | Yamanaka |
| 2008/0236005 A1 | 10/2008 | Isayev et al. |
| 2008/0255901 A1 | 10/2008 | Carroll et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0304219 A1 | 12/2008 | Chen |
| 2009/0009041 A1 | 1/2009 | Leidler |
| 2009/0009047 A1* | 1/2009 | Yanagawa ......... H05K 7/20009 313/46 |
| 2009/0009729 A1 | 1/2009 | Sakai |
| 2009/0016004 A1 | 1/2009 | McCoy |
| 2009/0086430 A1 | 4/2009 | Kang et al. |
| 2009/0104989 A1 | 4/2009 | Williams et al. |
| 2009/0120629 A1 | 5/2009 | Ashe |
| 2009/0122218 A1* | 5/2009 | Oh ................... G02F 1/133385 361/679.21 |
| 2009/0126906 A1 | 5/2009 | Dunn |
| 2009/0126907 A1 | 5/2009 | Dunn |
| 2009/0126914 A1 | 5/2009 | Dunn |
| 2009/0135365 A1 | 5/2009 | Dunn |
| 2009/0141199 A1 | 6/2009 | Fujikawa |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissiere |
| 2009/0241388 A1 | 10/2009 | Dunn |
| 2009/0244472 A1 | 10/2009 | Dunn |
| 2009/0278007 A1 | 11/2009 | Taylor |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2010/0060861 A1 | 3/2010 | Medin |
| 2010/0079949 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1* | 9/2010 | Nakamichi ............ H05K 5/02 348/836 |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019348 A1 | 1/2011 | Kludt et al. |
| 2011/0019363 A1 | 1/2011 | Vahlsing et al. |
| 2011/0051071 A1 | 3/2011 | Nakamichi et al. |
| 2011/0058326 A1 | 3/2011 | Idems et al. |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0114384 A1 | 5/2011 | Sakamoto et al. |
| 2011/0116000 A1 | 5/2011 | Dunn et al. |
| 2011/0116231 A1* | 5/2011 | Dunn ...................... H04N 5/64 361/695 |
| 2011/0122162 A1* | 5/2011 | Sato ................. G02F 1/133385 345/690 |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0227467 A1 | 9/2011 | Foppe, Jr. et al. |
| 2011/0261523 A1 | 10/2011 | Dunn et al. |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0050958 A1 | 3/2012 | Sanford et al. |
| 2012/0106081 A1 | 5/2012 | Hubbard et al. |
| 2012/0206687 A1 | 8/2012 | Dunn et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2013/0170140 A1 | 7/2013 | Dunn |
| 2013/0201685 A1 | 8/2013 | Messmore et al. |
| 2013/0211583 A1 | 8/2013 | Borra |
| 2013/0258659 A1 | 10/2013 | Erion |
| 2013/0270975 A1 | 10/2013 | Dunn et al. |
| 2013/0294039 A1* | 11/2013 | Chao ................... H05K 5/0204 361/752 |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0208626 A1 | 7/2014 | Moon |
| 2014/0313698 A1 | 10/2014 | Dunn et al. |
| 2014/0314395 A1 | 10/2014 | Dunn et al. |

FOREIGN PATENT DOCUMENTS

| | | |
|---|---|---|
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| GB | 153110 | 11/1920 |
| GB | 2402205 A | 12/2004 |
| JP | 402062015 A | 3/1990 |
| JP | 402307080 A | 12/1990 |
| JP | 3153212 A | 7/1991 |
| JP | 6082745 A | 3/1994 |
| JP | 8115788 A | 5/1996 |
| JP | 8194437 A | 7/1996 |
| JP | 8339034 A | 12/1996 |
| JP | H09246766 A | 9/1997 |
| JP | 11160727 A | 6/1999 |
| JP | H11296094 A | 10/1999 |
| JP | 2001090126 A | 8/2001 |
| JP | 2002158475 A | 5/2002 |
| JP | 2004053749 A | 2/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2005292939 A | 10/2005 |
| JP | 2005332253 A | 12/2005 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006198344 | 8/2006 |
| JP | 2007003638 A | 1/2007 |
| JP | 09307257 A | 11/2007 |
| JP | 2008010361 A | 1/2008 |
| JP | 2008292743 A | 12/2008 |
| JP | 2010024624 A | 2/2010 |
| KR | 200163508 Y1 | 7/2000 |
| KR | 200206768 Y1 | 12/2000 |
| KR | 200236278 Y1 | 10/2001 |
| KR | 2002-0057425 A | 7/2002 |
| KR | 200286961 Y1 | 8/2002 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| RU | 2513043 C2 | 4/2014 |
| WO | WO2005079129 A1 | 8/2005 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |

(56) References Cited

FOREIGN PATENT DOCUMENTS

| WO | WO2011059793 A2 | 5/2011 |
|---|---|---|
| WO | 2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012006620 A2 | 1/2012 |
| WO | WO2012021573 A2 | 2/2012 |
| WO | WO2012024426 A3 | 2/2012 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
I-Tech Company, 65" Outdoor Digital Signage Sunlight All Weather Proof LCD, 1 Page.
sunlightlcd.com, 46" All Weather NEMA4 Outdoor High Brightness (Model: GS4600L), Mar. 11, 2009, 2 Pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.

\* cited by examiner

HYBRID REAR COVER AND MOUNTING BRACKET FOR ELECTRONIC DISPLAY

CROSS-REFERENCE TO RELATED APPLICATIONS

This application is a continuation of U.S. patent application Ser. No. 14/645,076 filed on Mar. 11, 2015, which claims priority to U.S. Provisional Application No. 61/951,344 filed on Mar. 11, 2014. Both aforementioned applications are incorporated by reference as if fully recited herein.

TECHNICAL FIELD

Embodiments generally relate to systems and methods for installing and cooling electronic displays.

BACKGROUND OF THE ART

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures. Further, it is now desirable to provide an improved system for installing large electronic displays in public areas.

SUMMARY OF THE EXEMPLARY EMBODIMENTS

A system and method for mounting an electronic display is disclosed herein. A rear cover mounting bracket may contain a rear plate and a sidewall which surrounds a perimeter of the plate. A plurality of mounting holes may be placed within the plate to allow fastening the rear plate to a vertical surface. An electronic display assembly module may contain a thermal plate where the attachment of the rear cover mounting bracket to the module creates a plenum which can house one or more electronic components. In a preferred embodiment, the rear plate contains a pair of hooks and the module contains a pair of corresponding cylinders which can be engaged with the hooks so that the module can hang from the hooks.

The foregoing and other features and advantages of the present invention will be apparent from the following more detailed description of the particular embodiments, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
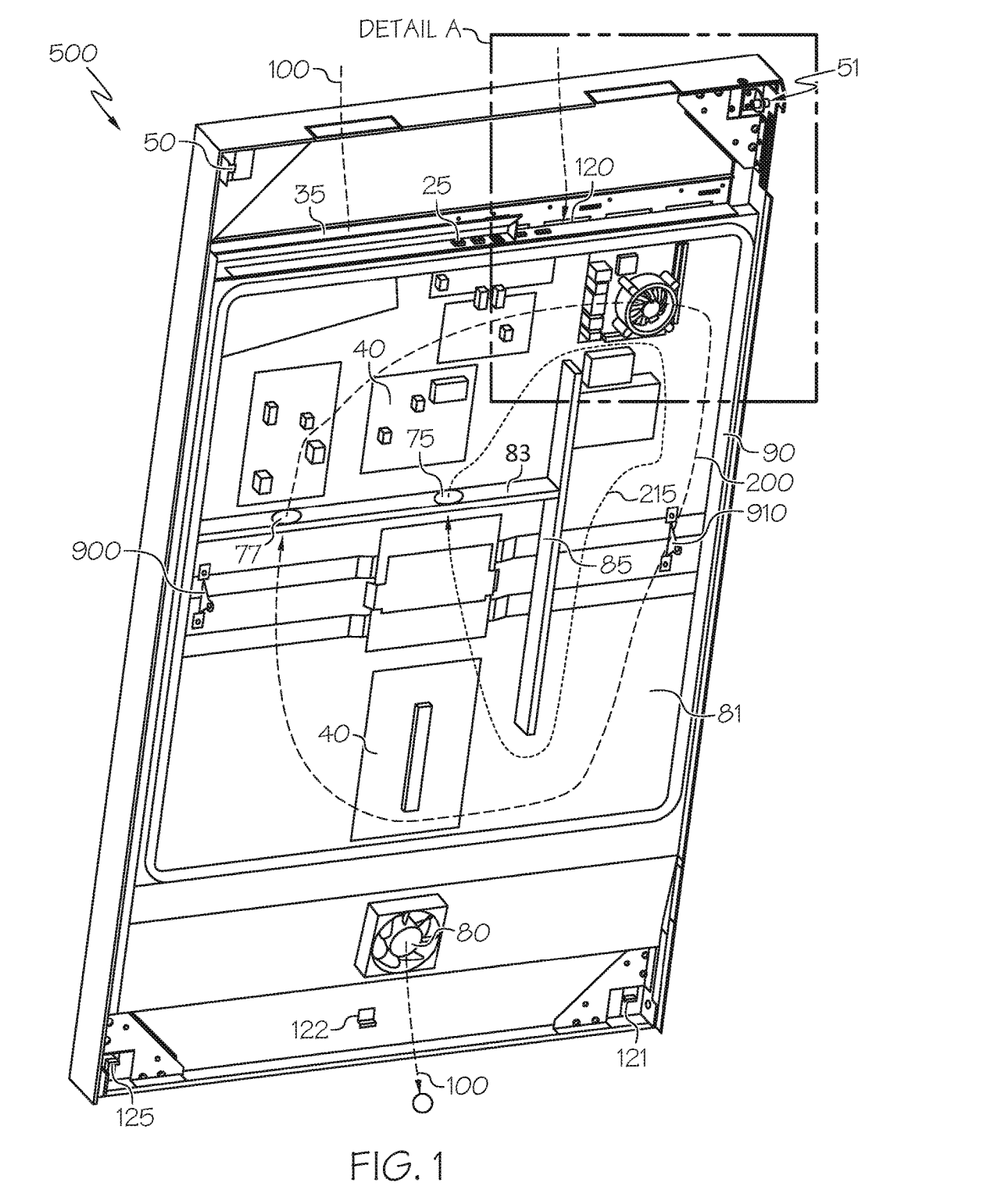
FIG. 1 is a rear perspective view of an exemplary electronic display assembly module showing Detail A.

FIG. 1 is a rear perspective view of an exemplary electronic display assembly module 500 showing Detail A. A thermal mounting sheet 81 is placed behind the electronic display and contains a plurality of electrical assemblies 40 which may include but are not limited to: power supplies, video players, hard drives, microprocessors, printed circuit boards, and input/output electronics. A narrow channel 120 is preferably defined by the space between the thermal sheet 81 and the rear surface of the electronic display. External air 100 may be forced through the channel 120 by fan 80, which can then extract heat from both the rear surface of the electronic display as well as the thermal mounting sheet 81.

A gasket 90 is preferably attached to the thermal mounting sheet 81 and surrounds a portion of the perimeter of the thermal mounting sheet 81. When combined with the hybrid rear cover mounting bracket 550, the gasket 90 and sheet 81 define a gaseously-sealed plenum 91 which may contain the electrical assemblies 40. One or more fans 75/77 may cause the air within the plenum 91 to circulate around. Preferably, a pair of dividing walls 83/85 are used to define a loop around the plenum 91 which passes through only one of the dividing walls (here 83). In an exemplary embodiment, dividing wall 83 is perpendicular to dividing wall 85. Even more preferably, dividing wall 83 is arranged horizontally and contains the fan(s) while dividing wall 85 is connected to the end of dividing wall 83 but is arranged vertically and does not contain a fan. For exemplary airflow, it has been discovered that placing the first fan 75 near the center of the display assembly and the second fan 77 near the perimeter of the display assembly, causes a pair of circulating gas loops 215 and 200 respectfully. Preferably, the plenum 91 is sealed so that external air cannot enter the plenum 91 (and preferably prevents air, or any other gaseous matter with or without particulate, from exiting the plenum 91).

A plurality of input/output electrical connections 25 are preferably placed at the top of the module 500 and underneath a water guard 35. Also, a pair of mounting pins 50 and 51 are arranged at the top of the module 500. A trio of latches 121, 122, 125 are preferably arranged at the bottom of the module 500, although embodiments can be practiced within one or two latches only. Also shown in this figure are the attachment brackets 900 and 910 for gas springs 250 or other supporting resistive elements.

Figure 2:
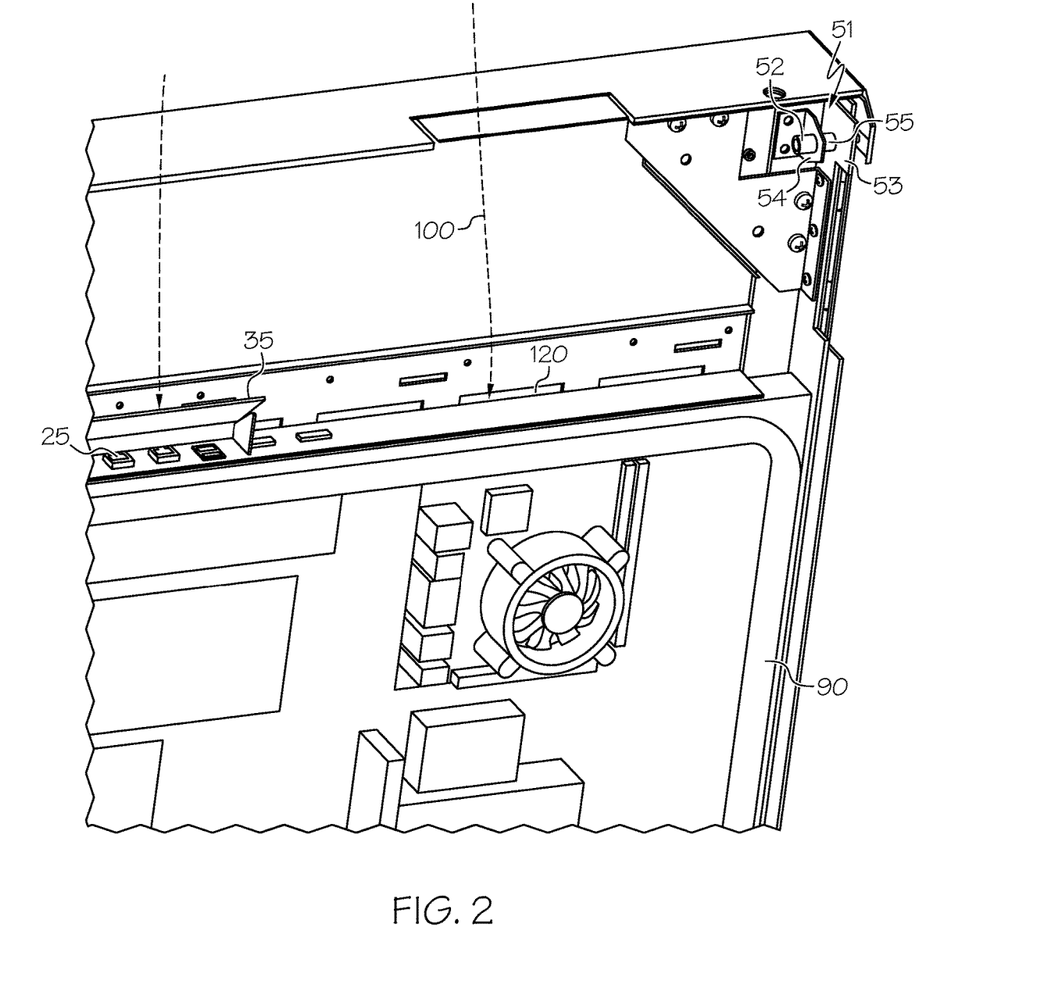
FIG. 2 is a detailed rear perspective view of Detail A shown in FIG. 1.

FIG. 2 is a detailed rear perspective view of Detail A shown in FIG. 1. Here, the details of the mounting pin (or rod or cylinder) 51 may be observed. In this embodiment, this can be described as a cylinder which travels horizontally and may be divided by two locating walls 53 (closest to the perimeter of the module 500) and 54 (closest to the center of the module 500). The cylinder can then be identified by the mounting portion 55 (located between walls 53/54) and the interior portion 52 (starting at the wall 54 and travelling towards the center of the module 500). The mounting pins can be solid or hollow and are preferably cylindrical.

Figure 3:
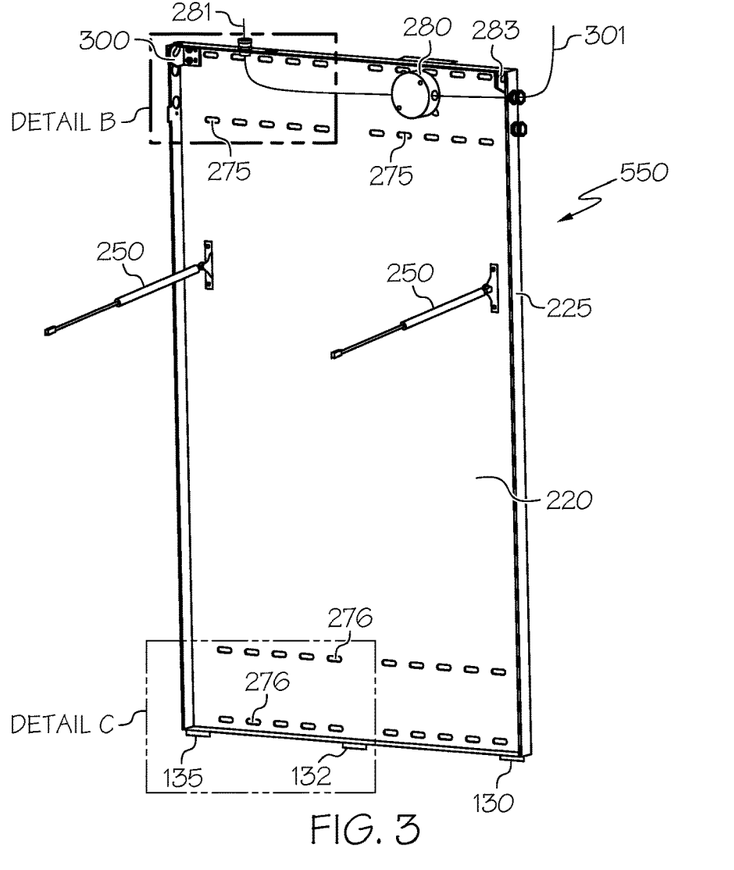
FIG. 3 is a front perspective view of an exemplary hybrid rear cover and mounting bracket, once fastened to a vertical surface and connected to service wiring.

FIG. 3 is a front perspective view of an exemplary hybrid rear cover and mounting bracket 550 (herein cover/bracket 550), once fastened to a vertical surface and connected to service wiring 281. The cover/bracket 500 preferably contains a substantially flat rear plate 220 with a sidewall 225 which surrounds the plate 220. A plurality of mounting holes 275 are preferably placed near the top of the cover/bracket 500 while another plurality of mounting holes 276 are placed near the bottom of the cover/bracket 500. In this way, the cover/bracket 500 can easily be mounted on a vertical surface where the service wiring 281 can be routed through the sidewall 225 and into a junction box 280 by a designated electrician. A second service line 283 may also exit the junction box 280 and could run to a second display module, allowing several cover/brackets to be installed and wired together in a daisy chain fashion. Generally, this electrical work requires permits, licenses, and/or approval by an electrical inspector. With this exemplary embodiment, this work can be completed and approved before the electronic display modules 500 are even shipped to the location.

A pair of gas springs 250 or other resistive device may be attached to the rear plate 220 and correspond with the attachment plates 900/910 on the electronic display module 500. A trio of latches 130, 132, and 135 may be placed at the bottom of the cover/bracket 550 and correspond to the latches 121, 122, and 125 on the module 500 respectively. Of course, as noted above, only a single latch or a pair of latches may be used in some embodiments. A pair of mounting hooks 300 and 301 are preferably placed at the top of the cover/bracket 550 and correspond to the mounting pins 50 and 51 respectively. Preferably, the hook 300 would wrap around a portion of the circumference of the mounting portions 55, where the hook 300 is stabilized laterally between the walls 54 and 53.

Figure 4:
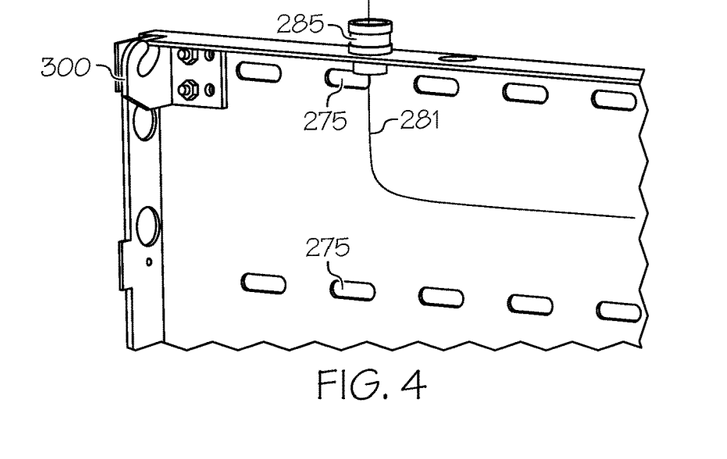
FIG. 4 is a detailed front perspective view of Detail B shown in FIG. 3.

FIG. 4 is a detailed front perspective view of Detail B shown in FIG. 3. A fitting 285 may permit conduit (not shown) to seal with the sidewall 225 and allow the service wire 281 to pass through the sidewall 225 to meet the junction box 280.

Figure 5:
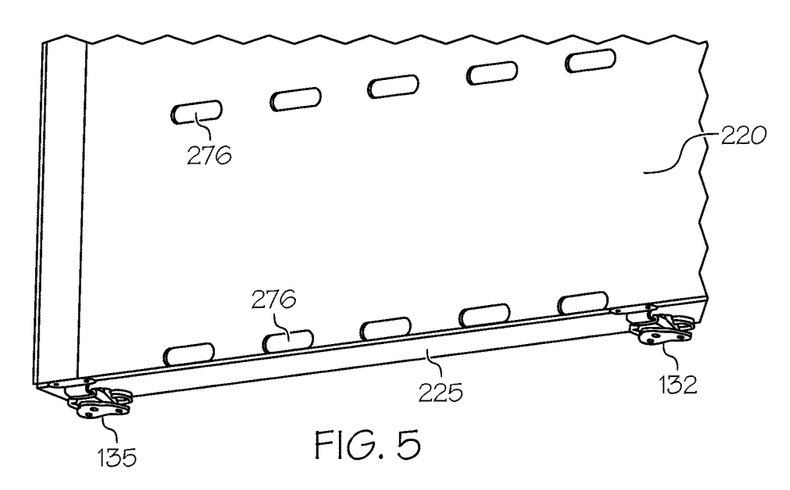
FIG. 5 is a detailed front perspective view of Detail C shown in FIG. 3.

FIG. 5 is a detailed front perspective view of Detail C shown in FIG. 3.

Figure 6:
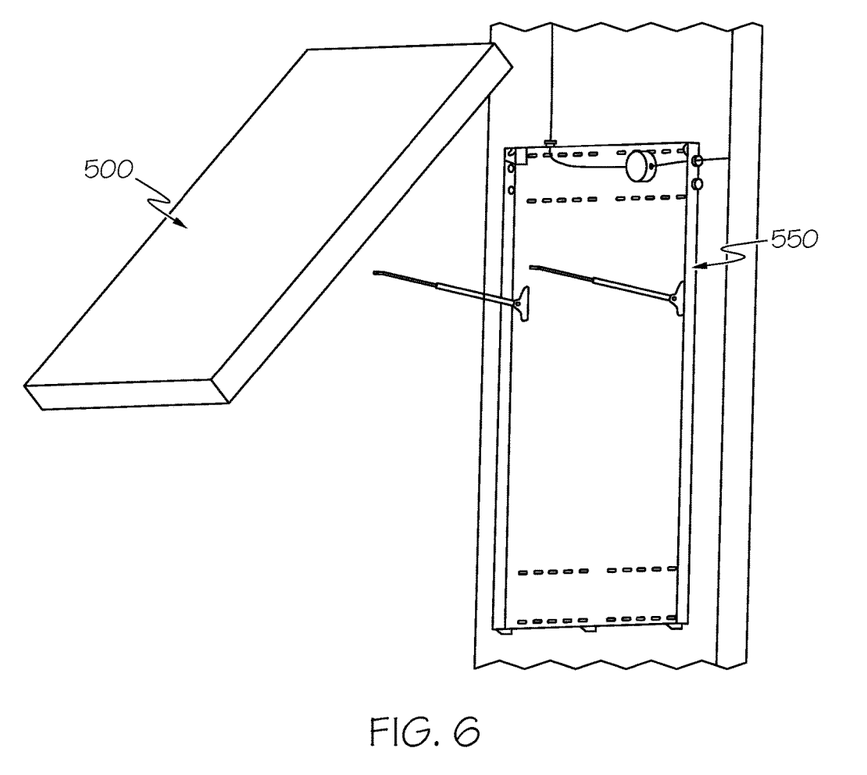
FIG. 6 is a front perspective view of the exemplary method for attaching the electronic display assembly module to the hybrid rear cover and mounting bracket.

FIG. 6 is a front perspective view of the exemplary method for attaching the electronic display assembly module 500 to the hybrid rear cover and mounting bracket 550. Once the cover/bracket 550 has been mounted to a vertical surface (and preferably after the service wiring has been ran to the junction box), the module 500 may hang from the interaction of the hooks 300/301 with the pins 51/50. At this point, the bottom of the module 500 can be rotated outwardly so that the gas springs 250 can be attached to the module 500. Once these are attached, the hooks 300/301 remain within the pins 51/50 but the bottom of the module 500 is held away from the cover/bracket 550 so that the module 500 can be electrically connected with the junction box 280. Once the module 500 is electrically connected, the bottom of the module 500 is rotated towards the cover/bracket 550 until the latches at the bottom of the two assemblies can be engaged.

Figure 7:
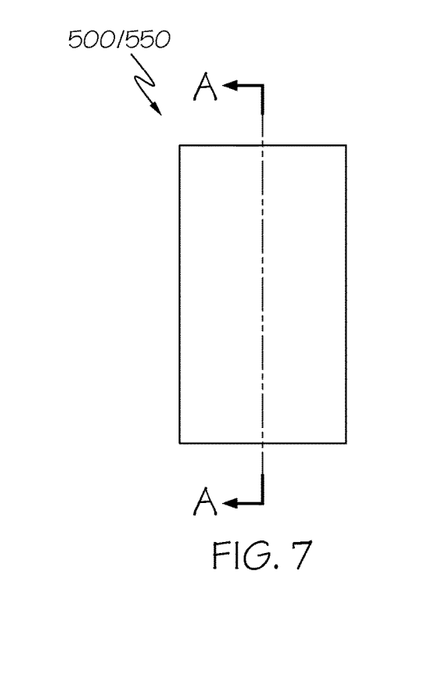
FIG. 7 is a front elevation view of the hybrid rear cover and mounting bracket once assembled with the electronic display assembly module and indicating the section line A-A.

FIG. 7 is a front elevation view of the hybrid rear cover and mounting bracket 550 once assembled with the electronic display assembly module 500 and indicating the section line A-A.

Figure 8:
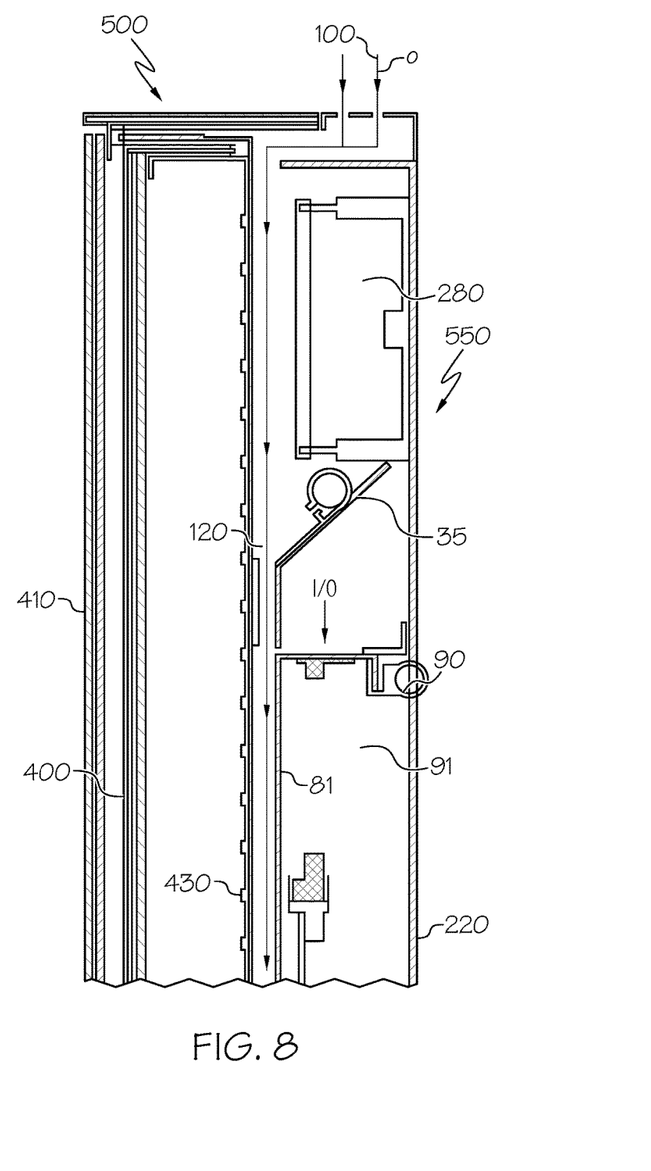
FIG. 8 is a partial section view taken along the section line A-A and showing the top portion of the assembly.

FIG. 8 is a partial section view taken along the section line A-A and showing the top portion of the assembly. When the latches at the bottom of the two assemblies engage, the gasket 90 is preferably compressed against the rear plate 220 to define the plenum 91. A front cover transparent plate 410 is preferably placed in front of the electronic display and a flow of external air 100 is shown travelling behind the electronic display and through the channel 120. Although any type of flat panel electronic display could be used, this particular embodiment uses an LCD display 400 with a direct LED backlight 430. Thus, in this embodiment, the channel 120 is defined between the rear surface of the LED backlight 430 and the thermal mounting plate 81. However, alternative embodiments may utilize any type of flat panel electronic display, including but not limited to plasma, OLED, electroluminescent polymers, or similar where the channel 120 is defined between the rear surface of these displays and the thermal plate 81.

Figure 9:
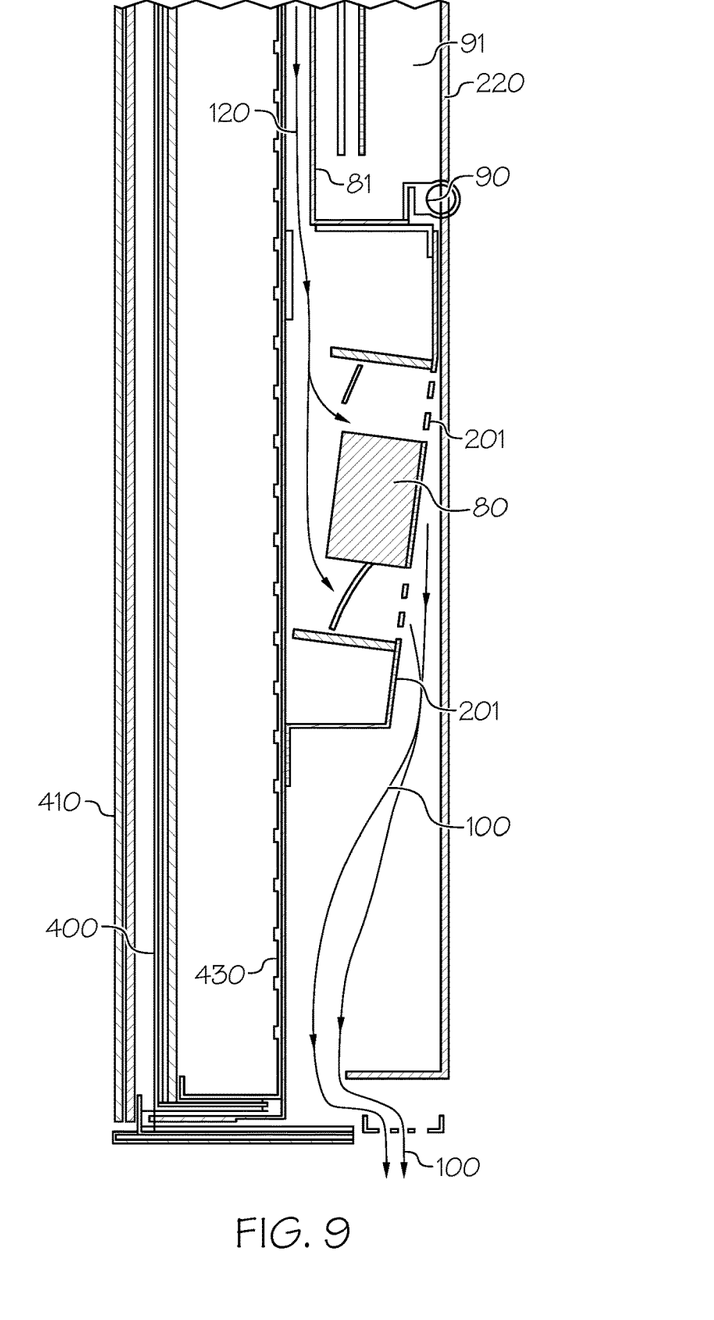
FIG. 9 is a partial section view taken along the section line A-A and showing the bottom portion of the assembly.

FIG. 9 is a partial section view taken along the section line A-A and showing the bottom portion of the assembly. The fan 80 is preferably positioned to draw the external air 100 through the channel 120, along the rear portion of the backlight 430 (or electronic display), and exhausted out of the bottom of the assembly. Of course, the external air 100 could also be ingested at the bottom and exhausted out of the top. The fan 80 is preferably placed within a cavity defined between the backlight 430 and the rear plate 220 and is preferably not immediately adjacent to the exhaust port on the housing, although this is not required. Generally speaking, a portion 201 of the housing may connect between the rear surface of the backlight 430 (or electronic display) and the rear plate 220, where the fan 80 is mounted on this portion 201 of the housing.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

We claim:

1. A system for mounting an electronic display comprising:
   a rear cover mounting bracket having a rear plate;
   an electronic display assembly module having a thermal plate where the electronic display assembly module attaches to the rear cover mounting bracket to define a gaseously sealed enclosed chamber between the thermal plate and the rear plate, wherein said enclosed chamber is located entirely behind the electronic display assembly;
   an electrical component placed within the enclosed chamber;
   wherein the electronic display assembly module is removably connected to the rear cover mounting bracket;
   a first partition within the enclosed chamber; and
   a circulating fan positioned within the enclosed chamber for circulating gas within the enclosed chamber.

2. The system of claim 1 further comprising:
   a plurality of mounting holes placed within the rear plate;
   the mounting holes are placed outside of the enclosed chamber; and
   wherein the rear cover mounting bracket has a sidewall which surrounds a perimeter of the plate.

3. The system of claim 2 wherein:
   the circulating fan is positioned on the first partition; and
   the circulating gas is air.

4. The system of claim 1 wherein:
   the rear plate is adapted to fit against a vertical surface.

5. The system of claim 1 further comprising:
   a channel defined by the space between an electronic display and the thermal plate; and
   a fan positioned to draw external air through the channel but not through the enclosed chamber.

6. The system of claim 1 further wherein the bottom side of the electronic display assembly module is adapted to rotate outwardly away from the rear cover mounting bracket when the electronic display assembly module is attached to the rear cover mounting bracket.

7. The system of claim 1 further comprising:
   a pair of hooks attached to the rear plate; and
   a pair of round posts attached to the electronic display assembly module which fit within the hooks and allow the electronic display assembly module to hang from the hooks.

8. The system of claim 1 wherein the electrical component is a power module.

9. The system of claim 1, further comprising:
   a second partition within the enclosed chamber that is oriented substantially perpendicular to the first partition;
   wherein the circulating fan is positioned on either the first or the second partition for circulating gas around the enclosed chamber; and
   wherein the gas within the enclosed chamber circulates in a loop pattern when the enclosed chamber is sealed.

10. A system for mounting an electronic display comprising:
    a rear cover mounting bracket having a rear plate;
    a pair of hooks attached to the rear plate;
    an electronic display assembly module containing an electronic display and having a pair of horizontal posts, each post being sized to fit within a hook so that the electronic display assembly module can hang from the hooks, the electronic display assembly module having a thermal plate wherein the electronic display assembly module attaches to the rear cover mounting bracket to define a plenum between the thermal plate and the rear plate;
    an electrical assembly placed within the plenum;
    a latch positioned near the bottom of the electronic display assembly module;
    wherein the electronic display assembly module is adapted to allow the bottom of the electronic display assembly module to rotate outwardly away from the rear cover mounting bracket when the electronic display assembly module is attached to the rear cover mounting bracket;
    a first partition within the plenum;
    a second partition within the plenum that is oriented substantially perpendicular to the first partition;
    a circulating fan positioned on either the first or the second partition for circulating gas around the plenum; and
    wherein the gas within the plenum circulates in a loop pattern when the plenum is sealed.

11. The system of claim 10 further comprising:
    a plurality of holes in the rear plate for attaching the rear plate to a wall.

12. The system of claim 10 further comprising:
    a pair of locating walls positioned on each post where the space between the locating walls defines an area of each post that is accepted by the hook.

13. The system of claim 10 further comprising:
    a channel within the electronic display assembly module that is defined by the space between the electronic display and a thermal plate;
    a fan positioned to force external air through the channel.

14. The system of claim 10 wherein the electrical assembly is a power module.

15. A method for mounting an electronic display comprising the steps of:
    attaching a rear cover mounting bracket to a vertical surface, said rear cover mounting bracket having a pair of hooks positioned near a top of the rear cover mounting bracket;
    presenting an electronic display assembly module having a thermal plate and a pair of horizontal rods near a top of the electronic display assembly module;
    engaging the horizontal rods with the hooks so that the electronic display assembly module can hang from the hooks;
    rotating a bottom portion of the electronic display assembly module outwardly away from the rear cover mounting bracket when the electronic display assembly module is attached to the rear cover mounting bracket;

attaching a bottom portion of the rear cover mounting bracket to the bottom portion of the electronic display assembly module;
creating an enclosed chamber between the rear cover mounting bracket and the thermal plate;
placing an electrical assembly within the enclosed chamber;
placing a first partition within the enclosed chamber;
positioning a circulating fan in the enclosed chamber for circulating gas within the enclosed chamber; and
circulating the gas in a loop pattern around the first partition when the enclosed chamber is sealed.

16. The method of claim 15 wherein:
the entire weight of the electronic display assembly module is permitted to hang from the hooks once engaged with the horizontal rods.

17. The method of claim 15 wherein:
the step of engaging the horizontal rods with the hooks comprises placing the hook on a portion of the rod which is defined by the space between a pair of locating walls.

18. The method of claim 15 wherein:
the step of attaching the rear cover mounting bracket to the electronic display assembly module comprises engaging a first portion of a latch which is attached to the rear cover mounting bracket with a second portion of a latch which is attached to the electronic display assembly module.

19. The method of claim 15 wherein:
the step of attaching the rear cover mounting bracket to the electronic display assembly creates the enclosed chamber which is sealed from the exterior air.

\* \* \* \* \*

UNITED STATES PATENT AND TRADEMARK OFFICE
CERTIFICATE OF CORRECTION

PATENT NO. : 10,212,845 B2
APPLICATION NO. : 15/494614
DATED : February 19, 2019
INVENTOR(S) : William Dunn et al.

Page 1 of 1

It is certified that error appears in the above-identified patent and that said Letters Patent is hereby corrected as shown below:

On the Title Page

On page 4, Column 1, Line 8 under References Cited U.S. Patent Documents, U.S. Patent Application No. 2009/0009041 reference, please delete inventor name "Leidler" and replace with inventor name - Zeidler -.

Signed and Sealed this
Second Day of April, 2019

Andrei Iancu
*Director of the United States Patent and Trademark Office*